US012568645B2

(12) United States Patent
Xie et al.

(10) Patent No.: US 12,568,645 B2
(45) Date of Patent: Mar. 3, 2026

(54) VERTICAL FIELD EFFECT TRANSISTOR WITH SELF-ALIGNED BACKSIDE TRENCH EPITAXY

(71) Applicant: International Business Machines Corporation, Armonk, NY (US)

(72) Inventors: Ruilong Xie, Niskayuna, NY (US); Brent A. Anderson, Jericho, VT (US); Shogo Mochizuki, Mechanicville, NY (US); Lawrence A. Clevenger, Saratoga Springs, NY (US); Albert M. Chu, Nashua, NH (US); Nicholas Anthony Lanzillo, Wynantskill, NY (US)

(73) Assignee: International Business Machines Corporation, Armonk, NY (US)

( * ) Notice: Subject to any disclaimer, the term of this patent is extended or adjusted under 35 U.S.C. 154(b) by 455 days.

(21) Appl. No.: 18/069,077

(22) Filed: Dec. 20, 2022

(65) Prior Publication Data

US 2024/0204100 A1 Jun. 20, 2024

(51) Int. Cl.
*H10D 30/63* (2025.01)
*H10D 30/01* (2025.01)
(Continued)

(52) U.S. Cl.
CPC ........... *H10D 30/63* (2025.01); *H10D 30/025* (2025.01); *H10D 64/01* (2025.01); *H10D 64/256* (2025.01); *H10D 64/258* (2025.01)

(58) Field of Classification Search
CPC .. H10D 30/63; H10D 30/025; H10D 30/6728; H10D 64/258
See application file for complete search history.

(56) References Cited

U.S. PATENT DOCUMENTS 6,008,519 A 12/1999 Yuan
6,486,511 B1 * 11/2002 Nathanson ............. H10D 30/63
257/136
(Continued)

FOREIGN PATENT DOCUMENTS

CN 120359823 A 7/2025
EP 3644375 A1 4/2020
WO 2024/134280 A1 6/2024

OTHER PUBLICATIONS

Ingebrandt, et al., "Backside contacted field effect transistor array for extracellular signal recording", Biosensors and Bioelectronics, vol. 18, 2003, pp. 429-435, <https://jar-labs.vomifix.com/uploads/1/3/7/2/13726040/backside_contact_2003.pdf>.
(Continued)

*Primary Examiner* — Vincent Wall
(74) *Attorney, Agent, or Firm* — Kimberly Zillig

(57) ABSTRACT

A semiconductor structure with self-aligned backside trench epitaxy includes a channel fin extending vertically from a bottom source/drain region of a field effect transistor. The bottom source/drain region includes a trench epitaxy later located underneath a bottommost surface of the channel fin. A high-k metal gate stack is disposed along sidewalls of the channel fin. The high-k metal gate is separated from the bottom source/drain region by a bottom spacer. A top source/drain region is located above a topmost surface of the channel fin. The top source/drain region is separated from the high-k metal gate by a top spacer. The semiconductor structure further includes a backside metal contact within a backside interlayer dielectric. The backside metal contact is electrically connected to, and vertically aligned with, the bottom source/drain region.

16 Claims, 11 Drawing Sheets

Section X

Section Y

(51) Int. Cl.
  H10D 64/01          (2025.01)
  H10D 64/23          (2025.01)

(56)          References Cited

U.S. PATENT DOCUMENTS

| | | | | |
|---|---|---|---|---|
| 9,356,043 | B1 | 5/2016 | Sakakibara et al. | |
| 9,595,535 | B1* | 3/2017 | Ogawa | H10B 43/50 |
| 9,773,913 | B1* | 9/2017 | Balakrishnan | H10D 30/6757 |
| 9,812,461 | B2 | 11/2017 | Doda et al. | |
| 9,911,748 | B2 | 3/2018 | Nishikawa | |
| 10,079,230 | B2 | 9/2018 | Stuber | |
| 10,242,994 | B2 | 3/2019 | Inomata et al. | |
| 11,081,559 | B1 | 8/2021 | Liang | |
| 11,177,370 | B2* | 11/2021 | Xie | H10D 30/63 |
| 2005/0218521 | A1* | 10/2005 | Lee | G11C 5/02 257/E27.098 |
| 2009/0032849 | A1* | 2/2009 | Higashino | H10D 30/63 438/192 |
| 2010/0213539 | A1* | 8/2010 | Masuoka | H10D 86/01 257/329 |
| 2012/0161229 | A1* | 6/2012 | Kwon | H10B 12/00 438/270 |
| 2013/0240983 | A1* | 9/2013 | Larrieu | H10D 30/014 257/329 |
| 2015/0318213 | A1* | 11/2015 | Tsai | H10D 30/014 438/268 |
| 2015/0318214 | A1* | 11/2015 | Tsai | H10D 84/016 438/268 |
| 2016/0104792 | A1* | 4/2016 | Banerjee | H10D 30/63 257/329 |
| 2016/0293756 | A1* | 10/2016 | Liu | H10D 30/62 |
| 2017/0047320 | A1* | 2/2017 | Naito | H10D 64/513 |
| 2017/0294377 | A1 | 10/2017 | Dunga et al. | |
| 2018/0190670 | A1 | 7/2018 | Ryckaert | |
| 2018/0315850 | A1 | 11/2018 | Liu | |
| 2019/0148362 | A1* | 5/2019 | Cheng | H10D 84/0144 257/296 |
| 2020/0126977 | A1* | 4/2020 | Moriya | H10D 30/665 |
| 2020/0135921 | A1* | 4/2020 | Chiang | H10D 88/01 |
| 2020/0152762 | A1* | 5/2020 | Ando | H10D 84/016 |
| 2020/0176611 | A1* | 6/2020 | Lee | H10D 62/292 |
| 2020/0219804 | A1* | 7/2020 | Jezewski | H10D 30/477 |
| 2020/0294998 | A1* | 9/2020 | Lilak | H01L 23/535 |
| 2021/0327766 | A1 | 10/2021 | Wang | |
| 2021/0343639 | A1* | 11/2021 | Wang | H01L 21/76897 |
| 2022/0157956 | A1 | 5/2022 | Chen | |
| 2023/0066312 | A1* | 3/2023 | Zhu | H10B 41/27 |
| 2023/0317782 | A1* | 10/2023 | Xie | H10D 64/017 257/288 |
| 2024/0204067 | A1* | 6/2024 | Xie | H01L 23/5286 |
| 2024/0386943 | A1* | 11/2024 | Sung | G11C 11/4096 |
| 2024/0420990 | A1* | 12/2024 | Zou | H10D 84/0149 |
| 2025/0008719 | A1* | 1/2025 | Sung | H10D 84/0167 |

OTHER PUBLICATIONS

"Patent Cooperation Treaty PCT Notification of Transmittal of the International Search Report and the Written Opinion of the International Searching Authority, or the Declaration", Applicant's file reference P202202125, International application No. PCT/IB2023/057990, Date of mailing Oct. 24, 2023, 10 pages.

* cited by examiner

<u>100</u>

100

Section X

100

Section Y

Section Y

Section X

Section Y

Section X

Section Y

Section X

Section Y

Section X

Section X

Section Y

Section Y

Section X

Section Y

Section X

Section Y

Section X

Section Y

Section X

VERTICAL FIELD EFFECT TRANSISTOR WITH SELF-ALIGNED BACKSIDE TRENCH EPITAXY

BACKGROUND

The present invention generally relates to the field of semiconductor devices, and more particularly to vertical field-effect transistors (VFETs).

VFETs have been pursued as a potential device option for scaling complementary metal-oxide semiconductors (CMOS) to the 5 nanometer (nm) node and beyond. As opposed to planar CMOS devices, VFETs are oriented vertically with a vertical fin or nanowire that extends upward from the substrate. The fin or nanowire forms the channel region of the transistor. A source region and a drain region are situated in electrical contact with the top and bottom ends of the channel region, while the gate is disposed on one or more of the fin or nanowire sidewalls. Thus, in VFETs the direction of the current flow between the source and drain regions is normal to the main surface of the substrate. Generally, forming bottom source and drain junctions in VFETs can be a challenging task due to control issues during epitaxial growth. Therefore, improved techniques for forming VFET's bottom source and drain junctions would be desirable.

SUMMARY

According to an embodiment of the present disclosure, a semiconductor structure includes a channel fin extending vertically from a bottom source/drain region of a field effect transistor, the bottom source/drain region including a trench epitaxy later located underneath a bottommost surface of the channel fin, a high-k metal gate stack disposed along sidewalls of the channel fin, the high-k metal gate being separated from the bottom source/drain region by a bottom spacer, and a top source/drain region located above a topmost surface of the channel fin, the top source/drain region being separated from the high-k metal gate by a top spacer.

According to another embodiment of the present disclosure, a method of forming a semiconductor structure includes forming a channel fin extending vertically from a bottom source/drain region of a field effect transistor, the bottom source/drain region including a trench epitaxy later located underneath a bottommost surface of the channel fin, forming a high-k metal gate stack disposed along sidewalls of the channel fin, the high-k metal gate being separated from the bottom source/drain region by a bottom spacer, and forming a top source/drain region located above a topmost surface of the channel fin, the top source/drain region being separated from the high-k metal gate by a top spacer.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
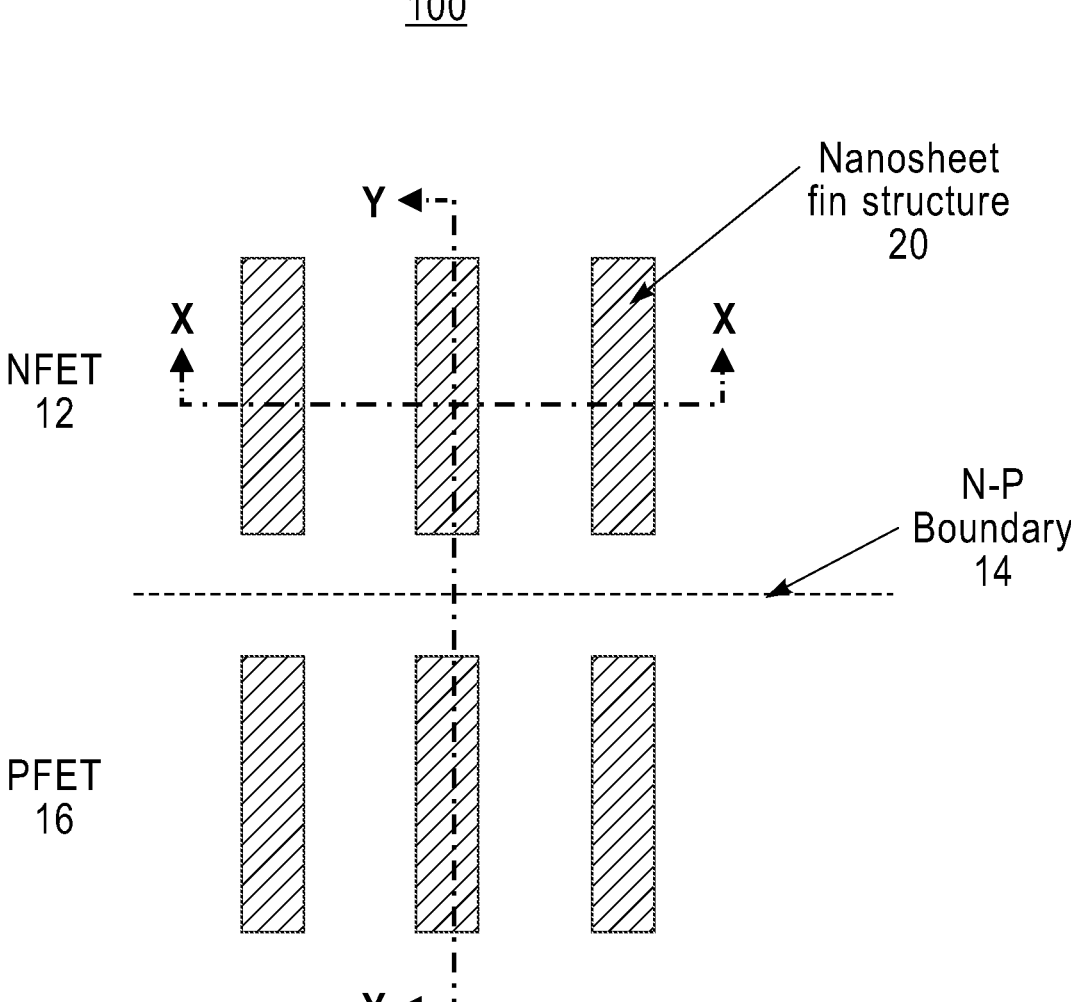
FIG. 1 is a top-down view of a semiconductor structure at an intermediate step during a semiconductor manufacturing process depicting different cross-sectional views used to describe embodiments of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Some non-planar transistor device architectures, such as VFETs, employ semiconductor fins and side-gates that can be contacted outside the active region, resulting in increased device density over lateral devices. In VFETs the source to drain current flows in a direction that is perpendicular to a major surface of the substrate. For example, in a known VFET configuration a major substrate surface is horizontal and a vertical fin extends upward from the substrate surface. The fin forms the channel region of the transistor. A source region and a drain region are situated in electrical contact with the top and bottom ends of the channel region, while a gate is disposed on one or more of the fin sidewalls. A bottom junction is formed at the interface between the channel fin and the bottom source/drain (S/D) region, and a top junction is formed at the interface between the channel fin and the top S/D region. As mentioned above, due to control issues during epitaxial growth, forming bottom source/drain regions in VFET devices can be a challenging task.

Therefore, embodiments of the present invention provide a VFET device, and a method of making the same, in which bottom source/drain regions are formed using backside interconnect processes. Specifically, the proposed VFET structure includes a backside trench epitaxy region formed beneath each semiconductor channel fin, with a first side of the backside trench epitaxy region being in direct contact with the semiconductor channel fins and a second side of the backside trench epitaxy region (opposing the first side) being in direct contact with a backside metal contact that is aligned with the backside trench epitaxy region to wire the VFET device to the backside interconnect. The backside trench epitaxy region provides a bottom source/drain region for the VFET device. Accordingly, by using backside interconnect processes, VFET's bottom source/drain contacts (CR) can be eliminated, which provides significant density and device performance improvements for VFET-based technology. Additionally, by omitting the bottom source/drain module during frontside processes, the manufacturing process is simplified while improving device performance and reliability.

Embodiments by which the VFET device with backside trench epitaxy can be formed are described in detail below by referring to the accompanying drawings in FIGS. 1-11B.

Referring now to FIG. 1, a top-down view of a semiconductor structure 100 is shown at an intermediate step during a semiconductor manufacturing process, according to an embodiment of the present disclosure. Particularly, FIG. 1 depicts different cross-sectional views of the semiconductor structure 100 that will be used to describe embodiments of the present disclosure. The cross-sectional views are taken along line X-X and line Y-Y. As depicted in the figure, line X-X represents a cut across nanosheet fin structures 20 of the semiconductor structure 100, while line Y-Y represents a cut along nanosheet fin structures 20 located in NFET region 12 and PFET region 16 of the semiconductor structure 100.

In this embodiment, the cross-sectional view taken along line Y-Y further includes a view of NFET regions 12 and/or PFET regions 16 and an area (N-P boundary) 14 between NFET and PFET regions 12, 16.

Figure 2A:
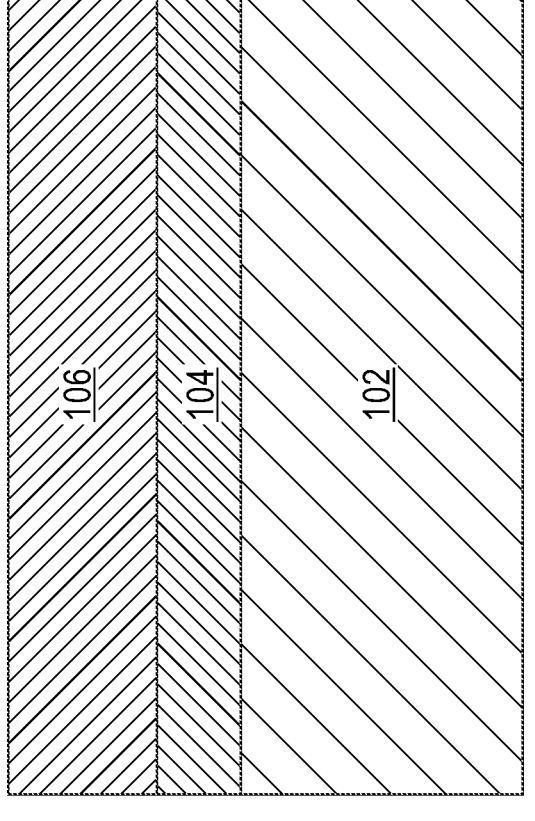
FIG. 2A is a cross-sectional view of the semiconductor structure taken along line X-X, as depicted in FIG. 1, depicting forming a first sacrificial layer and a first semiconductor layer, according to an embodiment of the present disclosure.
Figure 2B:
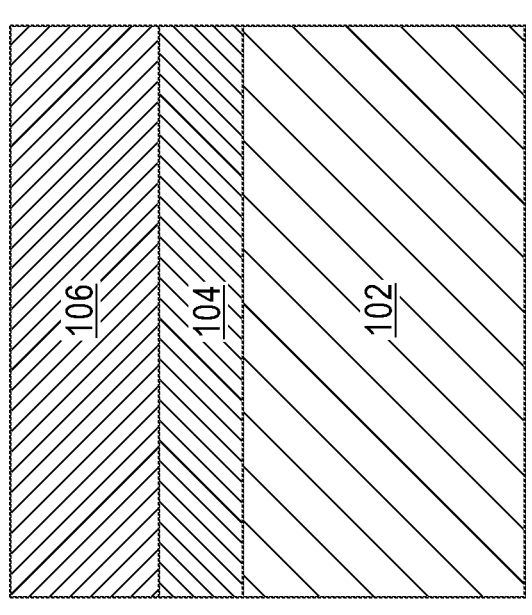
FIG. 2B is a cross-sectional view of the semiconductor structure taken along line Y-Y, as depicted in FIG. 1, according to an embodiment of the present disclosure.

Referring now to FIGS. 2A-2B, cross-sectional views of the semiconductor structure 100 are shown after forming a first sacrificial layer 104 and a first semiconductor layer 106, according to an embodiment of the present disclosure. In this embodiment, FIG. 2A is a cross-sectional view of the semiconductor structure 100 taken along line X-X, as depicted in FIG. 1; and FIG. 2B is a cross-sectional view of the semiconductor structure 100 taken along line Y-Y, as depicted in FIG. 1.

In the depicted embodiment, the semiconductor structure 100 includes a substrate 102, a first sacrificial layer 104 located above the substrate 102, and a first semiconductor layer 106 disposed above the first sacrificial layer 104. According to an embodiment, the first sacrificial layer 104 and the first semiconductor layer 106 are vertically stacked one on top of another in a direction perpendicular to the substrate 102, as illustrated in the figures.

The substrate 102 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium phosphide. Typically, the substrate 102 may be approximately, but is not limited to, several hundred microns thick. In other embodiments, the substrate 102 may be a layered semiconductor such as a silicon-on-insulator or SiGe-on-insulator, where a buried insulator layer, separates a base substrate from a top semiconductor layer.

According to an embodiment, the first sacrificial layer 104, can be formed on the substrate 102 using an epitaxial growth process. For instance, the first sacrificial layer 104 can be formed by epitaxially growing a layer of SiGe with a germanium concentration varying from approximately 15 atomic percent to approximately 35 atomic percent. In some embodiments, the first sacrificial layer 104 can be made of epitaxially grown SiGe with a germanium concentration of approximately 30 atomic percent. In other embodiments, the first sacrificial layer 104 may be made of silicon dioxide (SiO₂). In such embodiments, the combined structure formed by the substrate 102, the first sacrificial layer 104, and the first semiconductor layer 106 is a silicon on insulator (SOI) wafer, with the first sacrificial layer 104 being the buried oxide (BOX) including a thickness ranging from approximately 20 nm to approximately 100 nm, and ranges therebetween. The first sacrificial layer 104 may act as an etch stop layer during subsequent substrate removal.

The first semiconductor layer 106 can be formed by epitaxially growing a Si layer off the first sacrificial layer 104 to a thickness varying from approximately 30 nm to approximately 250 nm, although other thicknesses are within the contemplated scope of the invention.

In general, the first sacrificial layer 104 and the first semiconductor layer 106 can be formed by epitaxial growth by using the substrate 102 as the seed layer. Terms such as "epitaxial growth and/or deposition" and "epitaxially formed and/or grown" refer to the growth of a semiconductor material on a deposition surface of a semiconductor material, in which the semiconductor material being grown has the same or substantially similar crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same or substantially similar crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Non-limiting examples of various epitaxial growth processes include rapid thermal chemical vapor deposition (RTCVD), low-energy plasma deposition (LEPD), ultra-high vacuum chemical vapor deposition (UHVCVD), atmospheric pressure chemical vapor deposition (APCVD), metalorganic chemical vapor deposition (MOCVD), low-pressure chemical vapor deposition (LPCVD), limited reaction processing CVD (LRPCVD), and molecular beam epitaxy (MBE). The temperature for an epitaxial deposition process can range from 500° C. to 900° C. Although higher temperatures typically result in faster deposition, the faster deposition may result in crystal defects and film cracking.

A number of different precursors may be used for the epitaxial growth of the first sacrificial layer 104 and the first semiconductor layer 106. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, helium and argon can be used.

Figures 3A, 3B:
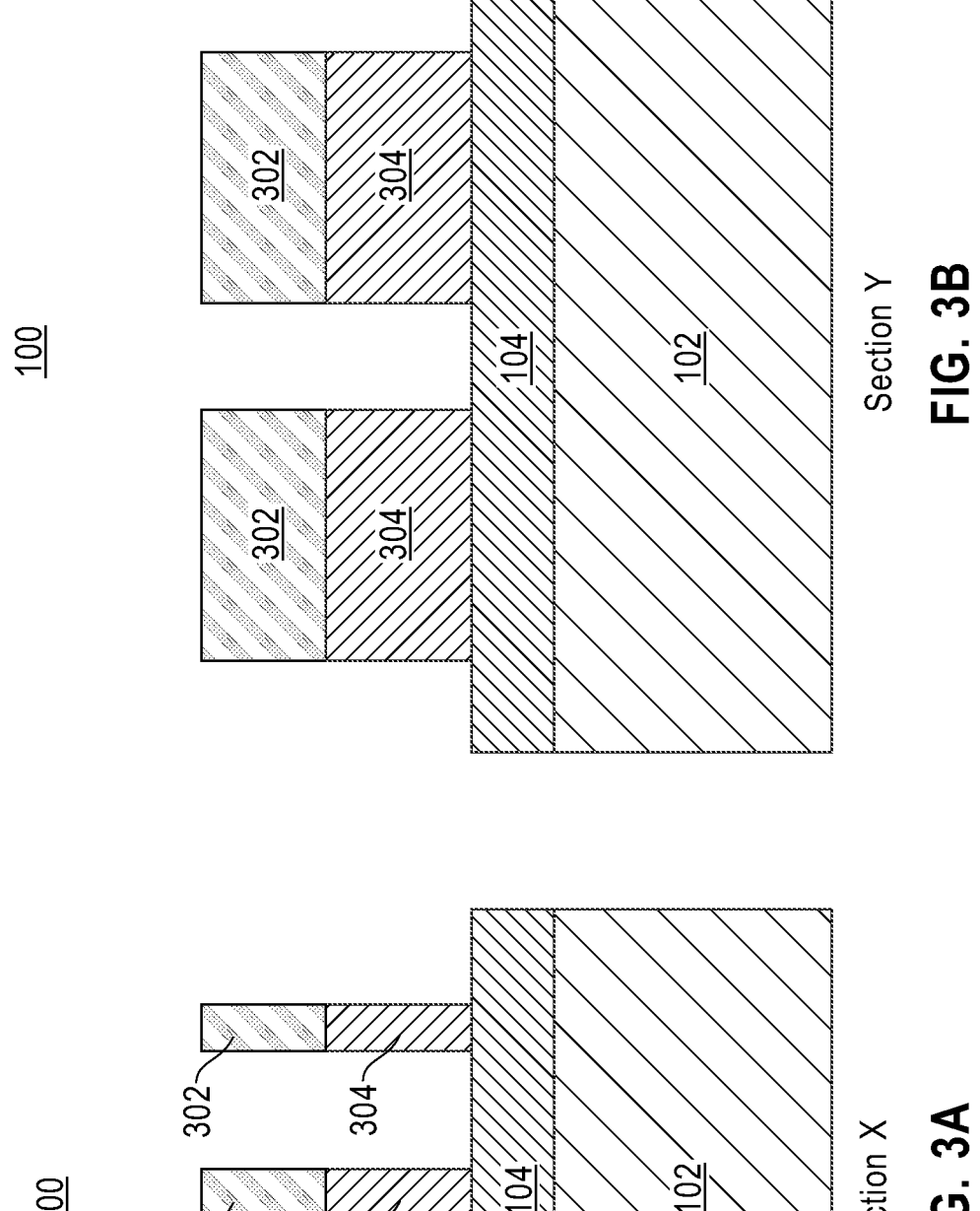
FIG. 3A is a cross-sectional view of the semiconductor structure taken along line X-X, as depicted in FIG. 1, depicting patterning a plurality of channel fin structures, according to an embodiment of the present disclosure.
FIG. 3B is a cross-sectional view of the semiconductor structure taken along line Y-Y, as depicted in FIG. 1, according to an embodiment of the present disclosure.

Referring now to FIGS. 3A-3B, cross-sectional views of the semiconductor structure 100 are shown after patterning a plurality of channel fin structures 304 (hereinafter "channel fins"), according to an embodiment of the present disclosure. In this embodiment, FIG. 3A is a cross-sectional view of the semiconductor structure 100 taken along line X-X, as depicted in FIG. 1; and FIG. 3B is a cross-sectional view of the semiconductor structure 100 taken along line Y-Y, as depicted in FIG. 1.

Patterning of channel fins 304 includes forming a hardmask layer 302 over the first semiconductor layer 106 (FIGS. 2A-2B) by depositing a hard mask material (e.g., silicon nitride) using, for example, chemical vapor deposition (CVD), plasma enhanced CVD (PECVD) or any suitable technique for dielectric deposition. By way of example only, the hardmask layer 302 may be formed having a thickness varying from approximately 20 nm to approximately 200 nm, although thicknesses greater than 200 nm and less than 20 nm may also be used.

After depositing the hardmask layer 302, a photolithographic patterning is then conducted on the deposited hardmask layer 302 to form a plurality of individual fin hardmasks. According to an exemplary embodiment, reactive ion etching (RIE) can be used to etch through the first semiconductor layer 106 (FIGS. 2A-2B) to form channel fins 304. The etching process may continue until exposing an uppermost surface of the first sacrificial layer 104.

Figures 4A, 4B:
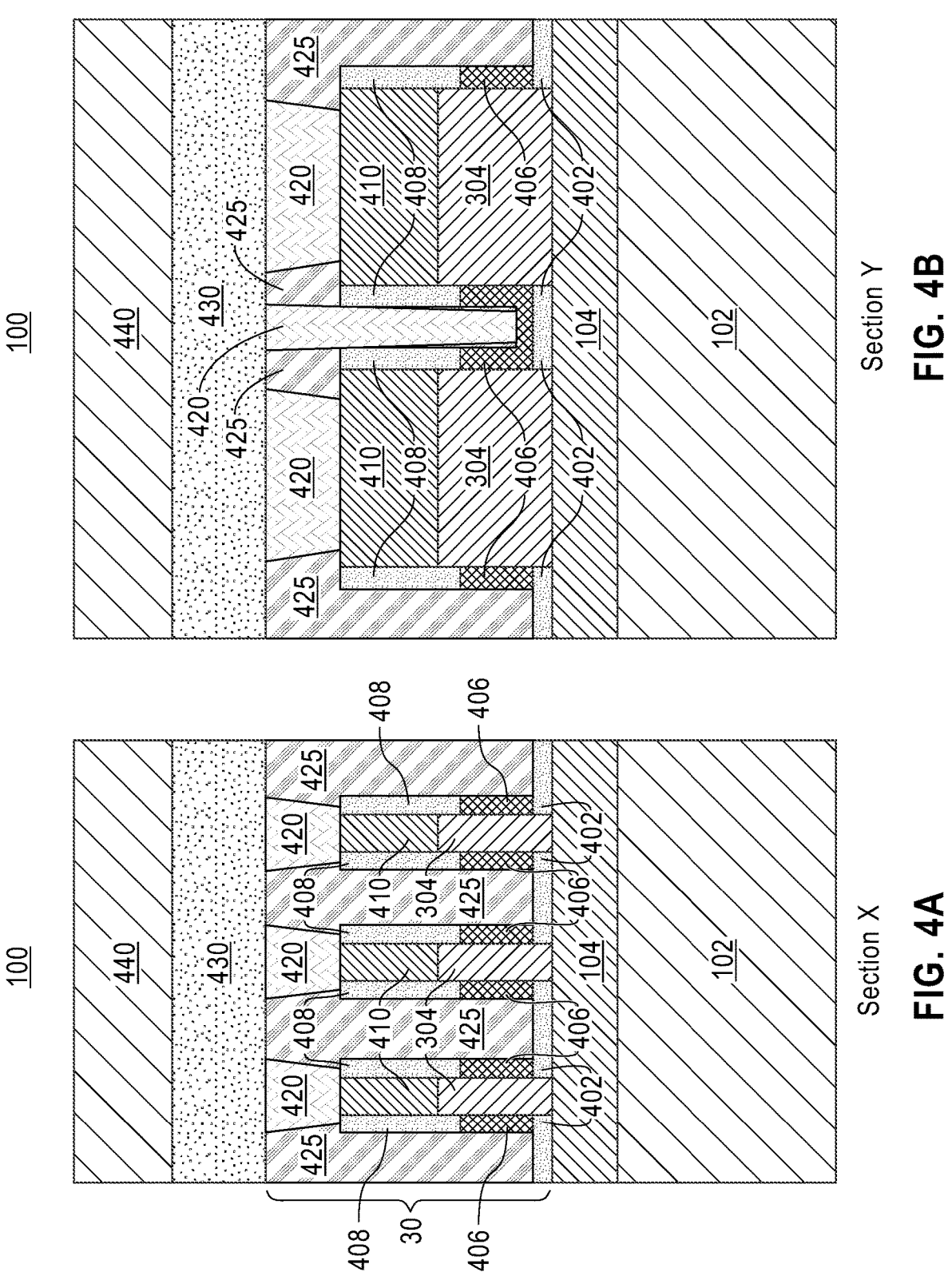
FIG. 4A is a cross-sectional view of the semiconductor structure taken along line X-X, as depicted in FIG. 1, depicting completing front-end-of-line processing steps, middle-of-line contact patterning and metallization, and forming a back-end-of-line interconnect level and a carrier wafer, according to an embodiment of the present disclosure.
FIG. 4B is a cross-sectional view of the semiconductor structure taken along line Y-Y, as depicted in FIG. 1, according to an embodiment of the present disclosure.

Referring now to FIGS. 4A-4B, cross-sectional views of the semiconductor structure 100 are shown after completing front-end-of-line (FEOL) processing steps, middle-of-line (MOL) contact patterning and metallization, and forming a back-end-of-line (BEOL) interconnect level 430 and a carrier wafer 440, according to embodiments of the present disclosure. In this embodiment, FIG. 4A is a cross-sectional view of the semiconductor structure 100 taken along line X-X, as depicted in FIG. 1; and FIG. 4B is a cross-sectional view of the semiconductor structure 100 taken along line Y-Y, as depicted in FIG. 1.

Known semiconductor fabrication operations have been used to form the semiconductor structure 100 as depicted in FIGS. 4A-4B. Thus, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In the depicted embodiment, the semiconductor structure 100 includes a bottom spacer 402 formed above the first sacrificial layer 104 and adjacent to a bottom portion of the channel fins 304. The bottom spacer 402 can include a dielectric material, such as, for example, SiN, SiC, SiOC, SiCN, BN, SiBN, SiBCN, SiOCN, SiOxNy, and combinations thereof. The dielectric material can be a low-k material having a dielectric constant less than about 7, less than about 5, or even less than about 2.5. The bottom spacer 402 can be formed using combinations of known deposition and etching processes, such as, for example, chemical vapor deposition (CVD), plasma-enhanced chemical vapor deposition (PECVD), atomic layer deposition (ALD), physical vapor deposition (PVD), chemical solution deposition, and etching processes including reactive ion etch (RIE), wet etch, or isotropic vapor phased dry etch.

The semiconductor structure 100 may further include a high-k metal gate stack 406 formed along, and in direct contact with, sidewalls of each of the channel fins 304. For ease of illustration, the high-k metal gate stack 406 is depicted as only one layer. However, as known by those skilled in the art, the high-k metal gate stack 406 can include a gate dielectric and a gate conductor/metal (e.g., a work function metal (WFM)) deposited over the bottom spacer 402 and adjacent to a portion of the channel fins 304. The high-k metal gate stack 406 may be conformally deposited on the semiconductor structure 100 using, for example, ALD.

The gate dielectric (not shown) can be formed from one or more gate dielectric films. The gate dielectric films can be a dielectric material having a dielectric constant greater than, for example, 3.9, 7.0, or 10.0. Non-limiting examples of suitable materials for the high-k dielectric films include oxides, nitrides, oxynitrides, silicates (e.g., metal silicates), aluminates, titanates, nitrides, or any combination thereof. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric films can further include dopants such as, for example, lanthanum and aluminum. The gate dielectric films can be formed by suitable deposition processes, for example, CVD, PECVD, ALD, PVD, chemical solution deposition, or other like processes. The thickness of the gate dielectric films can vary depending on the deposition process as well as the composition and number of high-k dielectric materials used.

The gate conductor (not shown) of the high-k metal gate stack 406 can include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments, the gate conductor can be a WFM deposited over the gate dielectric films by a suitable deposition process, for example, CVD, PECVD, PVD, plating, thermal or e-beam evaporation, and sputtering. The type of WFM depends on the type of transistor and can differ between n-FET and p-FET devices. P-type WFMs include compositions such as titanium nitride (TiN), ruthenium, palladium, platinum, cobalt, nickel, and conductive metal oxides, or any combination thereof. N-type WFMs include compositions such as titanium carbide (TiC), titanium aluminum carbide (TiAlC), hafnium, zirconium, titanium, tantalum, aluminum, metal carbides (e.g., hafnium carbide, zirconium carbide, titanium carbide, and aluminum carbide), aluminides, or any combination thereof. The gate conductor can further include a tungsten (W), titanium (Ti), aluminum (Al), cobalt (Co), or nickel (Ni) material over the WFM layer of the gate conductor. The gate conductor can be deposited by a suitable deposition process, for example, CVD, PECVD, PVD, plating, thermal or e-beam evaporation, and sputtering.

After forming the high-k metal gate stack 406, a patterning process is conducted on the semiconductor structure 100 to remove excess materials.

In one or more embodiments, a first layer of an interlevel dielectric 425 can be formed to fill voids between gate structures and other existing devices within the semiconductor structure 100. The interlevel dielectric 425 may be formed by, for example, CVD of a dielectric material. Non-limiting examples of dielectric materials to form the interlevel dielectric 425 may include silicon oxide, silicon nitride, hydrogenated silicon carbon oxide, silicon based low-k dielectrics, flowable oxides, porous dielectrics, or organic dielectrics including porous organic dielectrics.

Typically, after deposition of the interlevel dielectric 425, a chemical mechanical polishing (CMP) process is conducted on the semiconductor structure 100 to expose a top surface of the channel fins 304.

With continued reference to FIGS. 4A-4B, after removing the hardmask layer 302 (FIGS. 3A-3B), the high-k metal gate stack 406 can be recessed below a top surface of the channel fins 304, as shown in the figure. After that, a top spacer 408 can be conformally deposited above and in direct contact with the high-k metal gate stack 406. In such embodiments, the top spacer 408 may be deposited using, for example, CVD, PECVD, radio-frequency CVD (RFCVD), PVD, ALD, molecular layer deposition (MLD), molecular beam deposition (MBD), pulsed laser deposition (PLD), liquid source misted chemical deposition (LSMCD), sputtering, and/or plating. Non-limiting examples of materials forming the top spacer 408 may include silicon nitride (SiN), silicon boron nitride (SiBN), siliconborocarbonitride (SiBCN), or silicon oxycarbonitride (SiOCN).

According to an embodiment, a suitable etching technique (e.g., RIE) can be used to recess the top spacer 408 and expose a top surface of the channel fins 304. Top source/drain regions 410 can then be formed off the exposed top surface of the channel fins 304 using an epitaxial growth process similar to the one described above with respect to the first sacrificial layer 104 and first semiconductor layer 106. As shown in the figures, the top spacer 408 may cover the top source/drain regions 410 for electrically isolating each of the top source/drain regions 410 from the high-k metal gate stack 406. As known by those skilled in the art, top source/drain regions 410 are formed within corresponding NFET and PFET regions 12, 16 (shown in FIG. 1) of the semiconductor structure 100. Thus, top source/drain regions 410 may include, for example, epitaxially grown Si:B in embodiments in which the semiconductor structure 100 is a PFET device. In embodiments in which the semiconductor structure 100 is an NFET device, top source/drain regions 410 may include, for example, epitaxially grown Si:P.

It should be noted that although bottom spacer 402 and top spacer 408 are depicted on adjacent opposite sides of the channel fins 304, the bottom spacer 402 and the top spacer 408 surround an entire surface of the channel fins 304. The bottom spacer 402 and the top spacer 408 may determine a location of p-n junctions in the semiconductor structure 100.

To continue the manufacturing process, a second layer of the interlevel dielectric 425 can be formed in the semiconductor structure 100 followed by a planarization process. It should be noted that, for ease of illustration, only one layer of interlevel dielectric 425 is shown in the figures.

With continued reference to FIGS. 4A-4B, a plurality of conductive structures including metal contacts 420 can be subsequently formed in the semiconductor structure 100 for electrically connecting FEOL devices to subsequently formed metal levels. The process of forming the metal contacts 420 is standard and well-known in the art. Typically, the process includes forming trenches (not shown) within the interlevel dielectric 425 and subsequently filling the trenches with a conductive material or a combination of conductive materials to form metal contacts 420. In one or more embodiments, the conductive material filling the metal contacts 420 may include a silicide liner (e.g., titanium (Ti), nickel (Ni), nickel-platinum (NiPt) alloy, etc.), a metal adhesion liner (e.g., titanium nitride (TiN)), and a conductive metal (e.g., aluminum (Al), tungsten (W), copper (Co), ruthenium (Ru), or any combination thereof).

The conductive material may be deposited by a suitable deposition process, for example, CVD, PECVD, PVD, plating, thermal or e-beam evaporation, or sputtering. A planarization process, for example, CMP, is performed to remove any conductive material from upper surfaces of the semiconductor structure 100. In the depicted example, metal contacts 420 include top source/drain contacts that extend until an uppermost surface of each of the top source/drain regions 410 and gate contacts to the high-k metal gate stack 406.

A BEOL interconnect level 430 can then be formed above the FEOL device level 30. Although not depicted in the figures, the BEOL interconnect level 430 typically includes contacts, insulating layers (dielectrics), metal levels, and bonding sites for chip-to-package connections, as may be known by those skilled in the art. As mentioned above, various steps in the manufacture of semiconductor devices and semiconductor-based ICs are well known and so, in the interest of brevity, many conventional steps will only be mentioned briefly herein or will be omitted entirely without providing the well-known process details.

According to an embodiment, after forming the BEOL interconnect level 430, the semiconductor structure 100 (i.e., the semiconductor wafer) is bonded to carrier wafer (or auxiliary substrate) 440. The carrier wafer 440 may act as a reinforcing substrate for providing mechanical strength during processing (e g., thinning) of the semiconductor wafer. The process of bonding the semiconductor wafer to the carrier wafer 440 can be achieved by conventional wafer bonding process, such as dielectric-to-dielectric bonding or Cu-to-Cu bonding.

Accordingly, the carrier wafer 440 may include silicon oxide layers or SiCN layers, or any other layers applicable in the direct bonding technology applied in state of the art packaging techniques. Bonding of the device wafer to the carrier wafer 440 takes place by such known direct bonding techniques, thus obtaining the assembly shown in FIGS. 4A-4B.

Figures 5A, 5B:
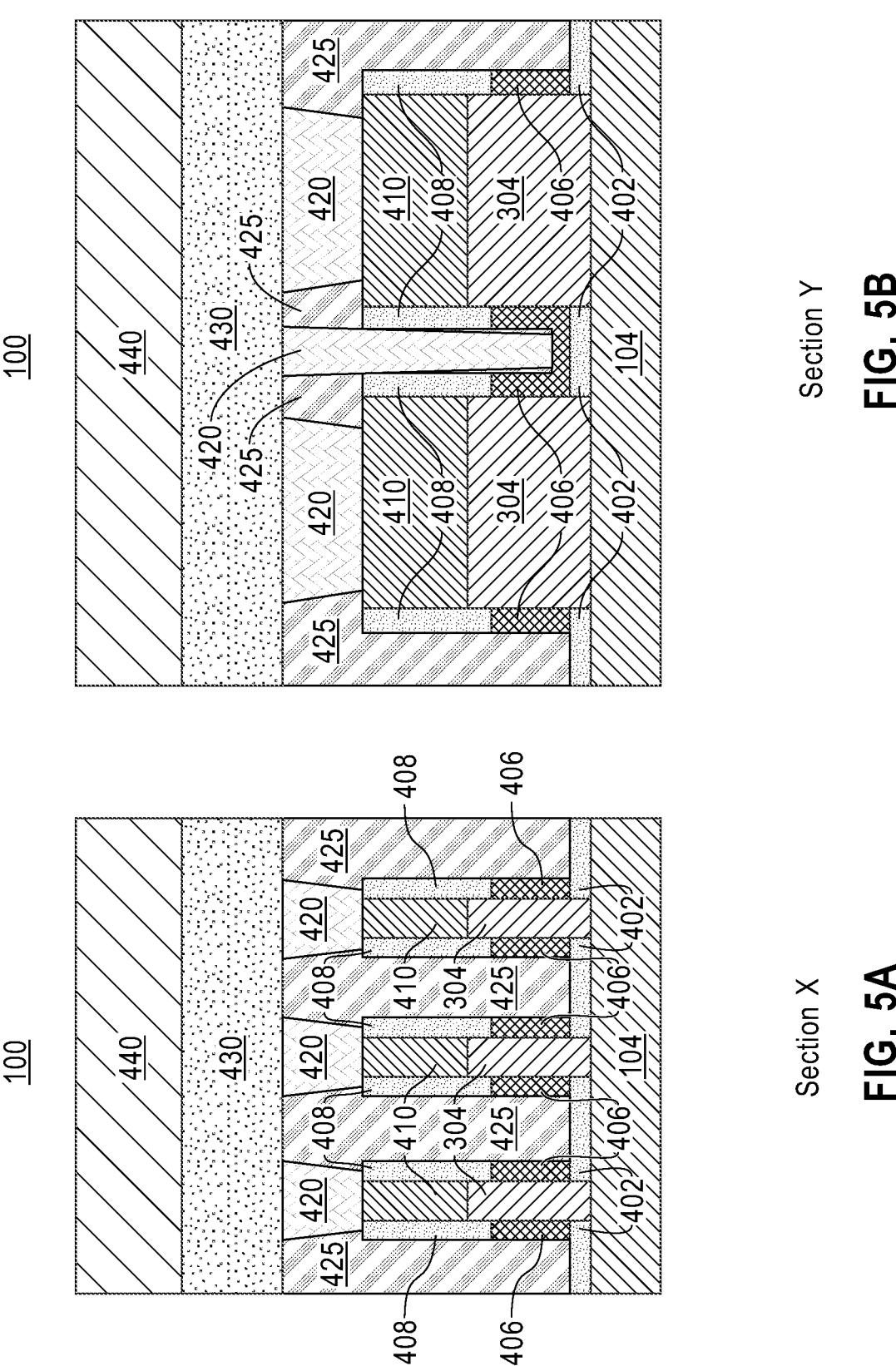
FIG. 5A is a cross-sectional view of the semiconductor structure taken along line X-X, as depicted in FIG. 1, depicting substrate removal, according to an embodiment of the present disclosure.
FIG. 5B is a cross-sectional view of the semiconductor structure taken along line Y-Y, as depicted in FIG. 1, according to an embodiment of the present disclosure.

Referring now to FIGS. 5A-5B, cross-sectional views of the semiconductor structure 100 are shown after substrate removal, according to embodiments of the present disclosure. In this embodiment, FIG. 5A is a cross-sectional view of the semiconductor structure 100 taken along line X-X, as depicted in FIG. 1; and FIG. 5B is a cross-sectional view of the semiconductor structure 100 taken along line Y-Y, as depicted in FIG. 1.

In the depicted embodiments, after the wafer is flipped (not shown), the substrate 102 can be removed using regular grinding, CMP and selective etching processes including wet or dry etching techniques. According to an embodiment, the grinding process is conducted until substantially removing the substrate 102 from the semiconductor structure 100 and only a few microns of Si remains. After that, an optional CMP process can be further used to reduce the thickness variation, and finally a highly selective Si etching process is used to remove the remaining substrate 102 from the semiconductor structure 100. In the depicted embodiment, the first sacrificial layer 104 act as an etch stop during the highly selective Si removal process, preventing excessive Si etch which may cause damage to channel fins 304 and high-k metal gate stack 406.

Figures 6A, 6B:
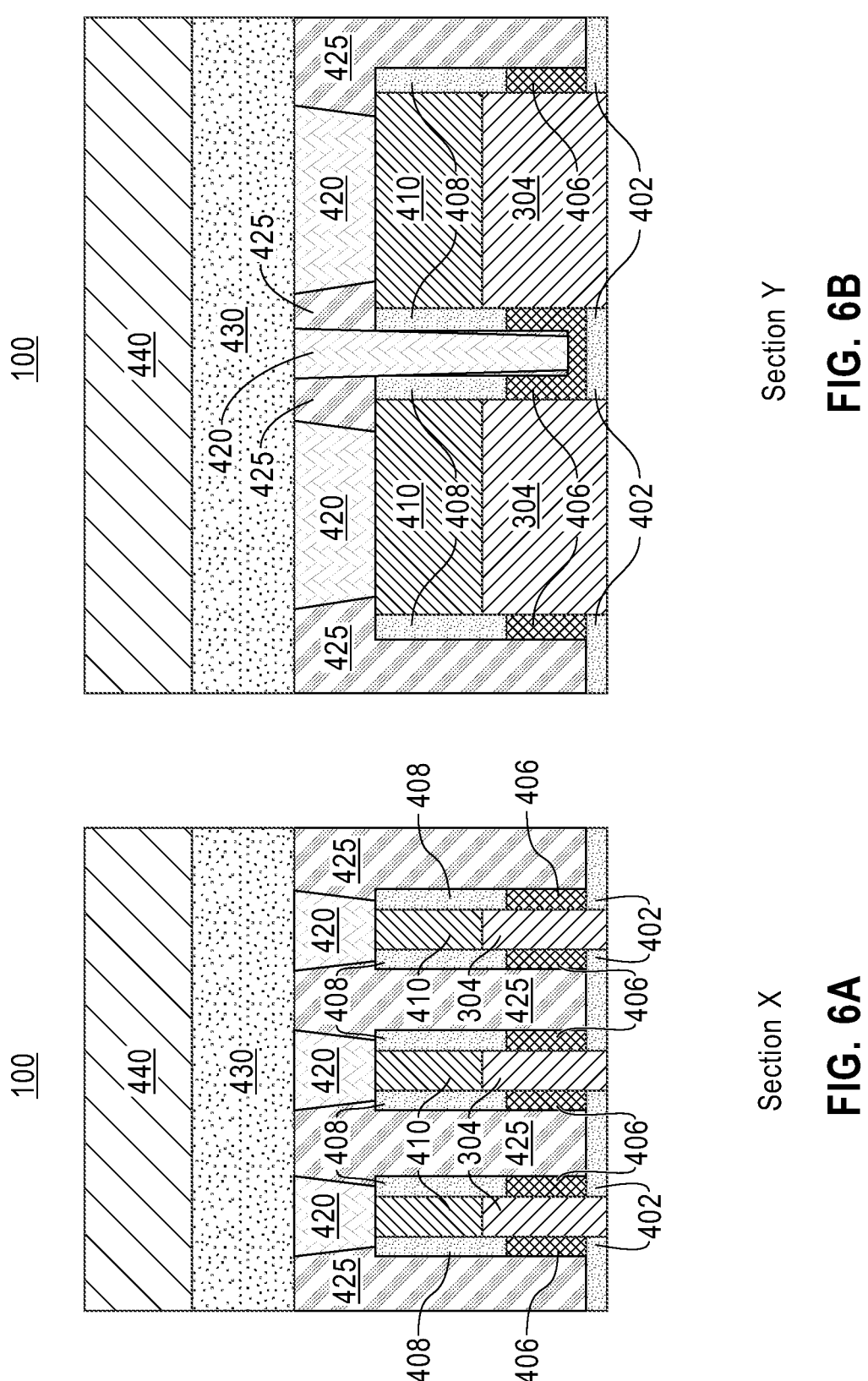
FIG. 6A is a cross-sectional view of the semiconductor structure taken along line X-X, as depicted in FIG. 1, depicting removing the first sacrificial layer, according to an embodiment of the present disclosure.
FIG. 6B is a cross-sectional view of the semiconductor structure taken along line Y-Y, as depicted in FIG. 1, according to an embodiment of the present disclosure.

Referring now to FIGS. 6A-6B, cross-sectional views of the semiconductor structure 100 are shown after removing the first sacrificial layer 104, according to embodiments of the present disclosure. In this embodiment, FIG. 6A is a cross-sectional view of the semiconductor structure 100 taken along line X-X, as depicted in FIG. 1; and FIG. 6B is a cross-sectional view of the semiconductor structure 100 taken along line Y-Y, as depicted in FIG. 1.

In the depicted embodiment, any suitable etching technique may be used to remove the first sacrificial layer 104 (FIGS. 5A-5B). In embodiments in which the first sacrificial layer 104 (FIGS. 5A-5B) is made of SiGe, a hot SC1 or dry HCl etch can be used to remove the first sacrificial layer 104. In embodiments in which the first sacrificial layer 104 (FIGS. 5A-5B) is made of $SiO_2$, DHF wet clean can be used to remove the first sacrificial layer 104.

Figures 7A, 7B:
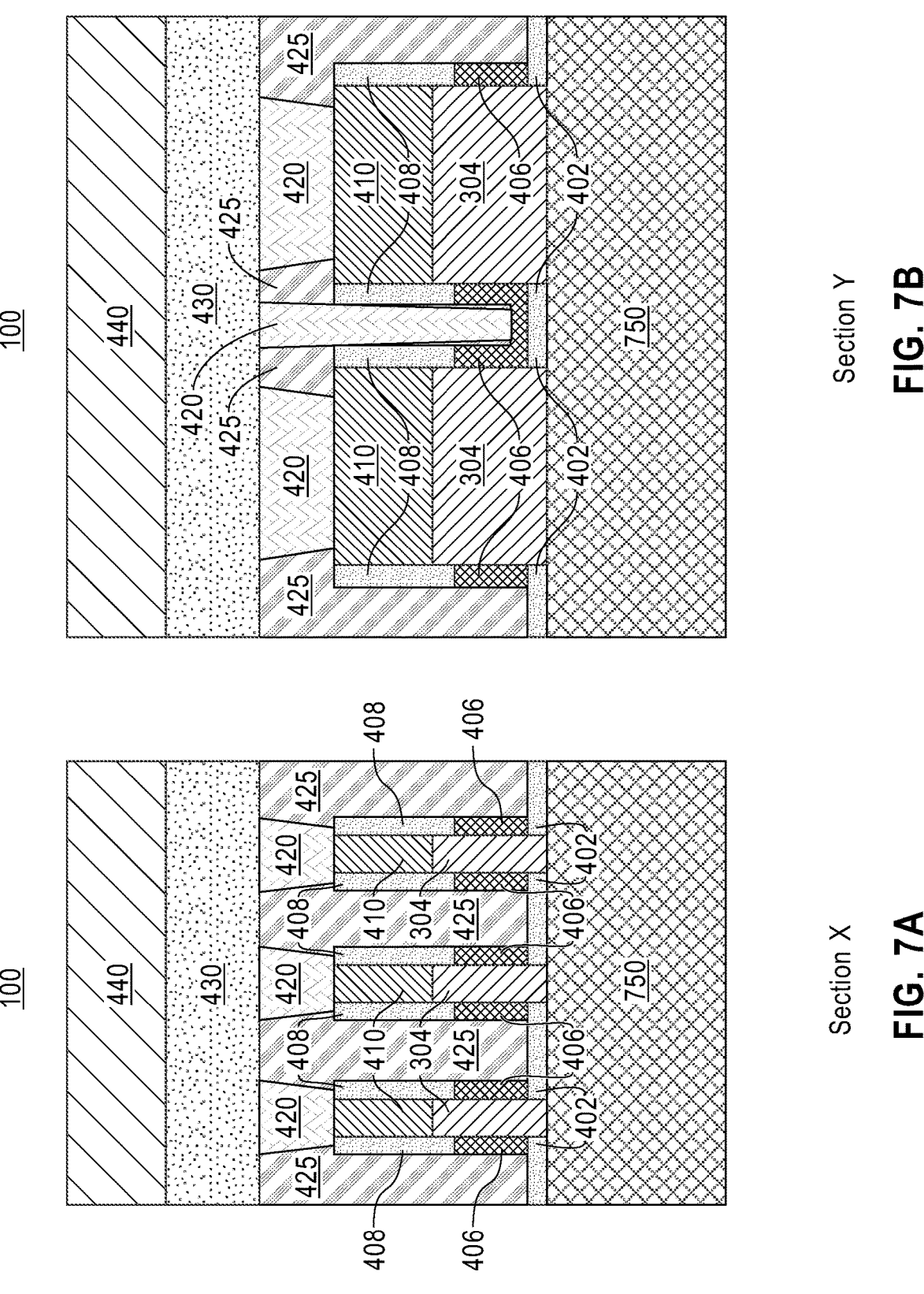
FIG. 7A is a cross-sectional view of the semiconductor structure taken along line X-X, as depicted in FIG. 1, depicting forming a first backside interlayer dielectric, according to an embodiment of the present disclosure.
FIG. 7B is a cross-sectional view of the semiconductor structure taken along line Y-Y, as depicted in FIG. 1, according to an embodiment of the present disclosure.

Referring now to FIGS. 7A-7B, cross-sectional views of the semiconductor structure 100 are shown after forming a first backside interlayer dielectric (BILD) 750, according to an embodiment of the present disclosure. In this embodiment, FIG. 7A is a cross-sectional view of the semiconductor structure 100 taken along line X-X, as depicted in FIG. 1; and FIG. 7B is a cross-sectional view of the semiconductor structure 100 taken along line Y-Y, as depicted in FIG. 1.

The first BILD 750 is formed using standard methods and materials, such as those used to form the interlevel dielectric 425 described above with reference to FIGS. 4A-4B. The first BILD 750 is disposed above, and in direct contact with, a bottommost surface of the channel fins 304 and a bottommost surface of the bottom spacer 402, as shown in the figures. In an exemplary embodiment, a thickness of the first BILD 750 may vary between approximately 40 nm to approximately 300 nm, and ranges therebetween. In one or more embodiments, a planarization process (e.g., CMP) can be conducted on the semiconductor structure 100 after forming the first BILD 750.

Figures 8A, 8B:
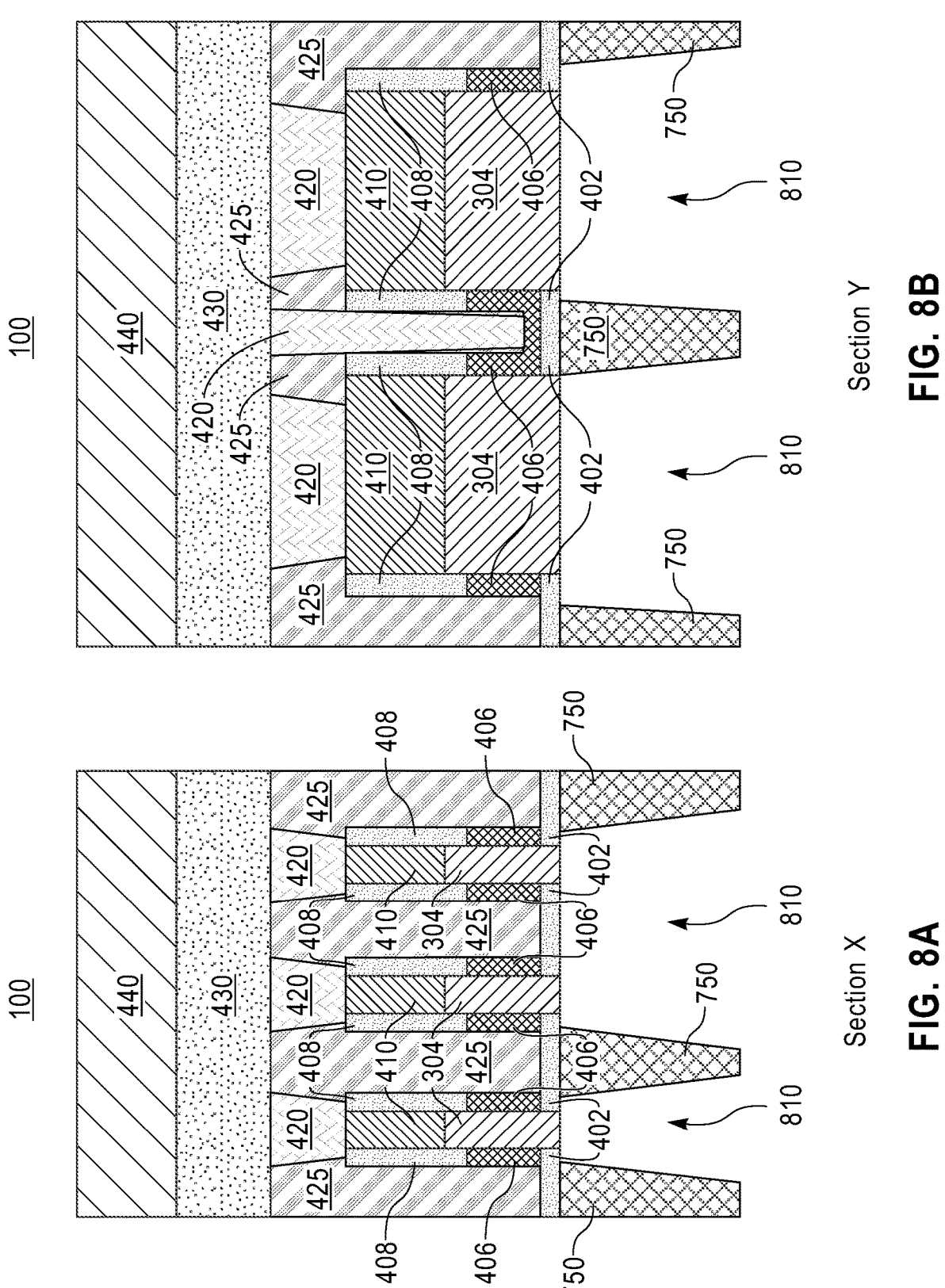
FIG. 8A is a cross-sectional view of the semiconductor structure taken along line X-X, as depicted in FIG. 1, depicting forming a plurality of backside contact openings, according to an embodiment of the present disclosure.
FIG. 8B is a cross-sectional view of the semiconductor structure taken along line Y-Y, as depicted in FIG. 1, according to an embodiment of the present disclosure.

Referring now to FIGS. 8A-8B, cross-sectional views of the semiconductor structure 100 are shown after forming a plurality of backside contact openings 810 (hereinafter "backside contact openings"), according to an embodiment of the present disclosure. In this embodiment, FIG. 8A is a cross-sectional view of the semiconductor structure 100 taken along line X-X, as depicted in FIG. 1; and FIG. 8B is a cross-sectional view of the semiconductor structure 100 taken along line Y-Y, as depicted in FIG. 1.

As known by those skilled in the art, patterning of the first BILD 750 to form backside contact openings 810 involves exposing a pattern on a photoresist layer (not shown) and transferring the exposed pattern to the first BILD 750. After transferring the pattern and forming the backside contact openings 810, the photoresist layer can be removed using any photoresist striping method known in the art including, for example, plasma ashing. As depicted in the figures, backside contact openings 810 expose the bottommost surface of the channel fins 304 and portions of the bottom spacer 402.

Figures 9A, 9B:
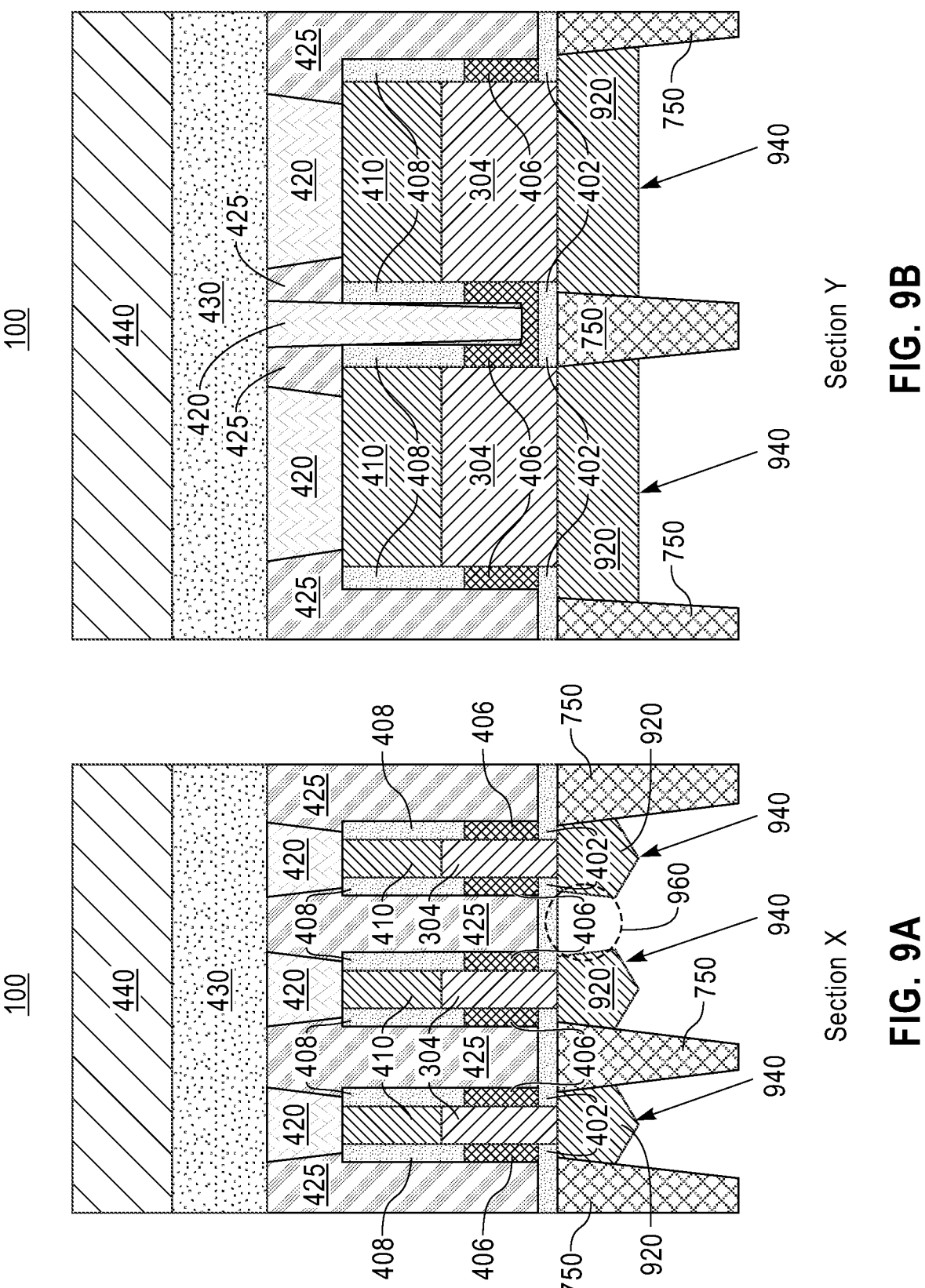
FIG. 9A is a cross-sectional view of the semiconductor structure taken along line X-X, as depicted in FIG. 1, depicting forming a trench epitaxy layer, according to an embodiment of the present disclosure.
FIG. 9B is a cross-sectional view of the semiconductor structure taken along line Y-Y, as depicted in FIG. 1, according to an embodiment of the present disclosure.

Referring now to FIGS. 9A-9B, cross-sectional views of the semiconductor structure 100 are shown after forming a trench epitaxy layer 920 on exposed portions of the channel fins 304, according to an embodiment of the present disclosure. In this embodiment, FIG. 9A is a cross-sectional view of the semiconductor structure 100 taken along line X-X, as depicted in FIG. 1; and FIG. 9B is a cross-sectional view of the semiconductor structure 100 taken along line Y-Y, as depicted in FIG. 1.

In one or more embodiments, the trench epitaxy layer 920 can be epitaxially grown using, for example, VPE, MBE, or LP. Low-temperature epitaxial processes are highly preferred due to inducing large threshold voltage shifts in formed gates at temperatures above about 500° C. In some embodiments, the trench epitaxy layer 920 includes similar materials and a same dopant concentration as the top source/drain region 410. State differently, trench epitaxy layer 920 is made compatible to the respective top source/drain region 410, that is, if top source/drain region 410 is n-type (NFET), then the trench epitaxy layer 920 is also n-type, if top source/drain region 410 is p-type (PFET), then the trench epitaxy layer 920 is also p-type.

For instance, trench epitaxy layer 920 can be formed to have the crystalline structure of the layer underneath. In this case, the trench epitaxy layer 920 can be grown to have the crystalline structure of the channel fins 304, and the trench epitaxy layer 920 is the bottom source/drain region of the transistor. In an exemplary embodiment, for NFET devices, the trench epitaxy layer 920 may be formed as silicon doped with phosphorus (Si:P), silicon doped with arsenic (Si:As), etc. For PFET devices, the trench epitaxy layer 920 may be formed as silicon doped with boron Si:B, germanium doped with boron (Ge:B), silicon germanium doped with boron (SiGe:B), etc.

Accordingly, the trench epitaxy layer 920 provides a bottom source/drain region 940 to the semiconductor structure 100. As can be observed in the figures, the (backside) trench epitaxy layer 920 is in contact with a first (bottom) surface of the channel fins 304 opposing a second (top) surface of the channel fins 304 in contact with the top source/drain regions 410. In an exemplary embodiment, the trench epitaxy layer 920 can be formed to a thickness varying from approximately 10 nm to approximately 50 nm, although other thicknesses are within the contemplated scope of the invention. In one or more embodiments, the trench epitaxy layer 920 is partially in contact with the bottom spacer 402. It should be noted that, in some embodiments, according to design requirements, backside contact openings 810 (FIGS. 8A-8B) can expose an area corresponding to two adjacent channel fins 304, as shown in FIG. 8A. In such cases, a space or gap 960 may remain between the adjacent channel fins 304 after forming the trench epitaxy layer 920, as depicted in FIG. 9A.

As may be known by those skilled in the art, the diamond/triangular shape observed in the trench epitaxy layer 920 forming the bottom source/drain regions 940 may be a consequence of the different growth rates during the epitaxial deposition process inherent to each crystallographic orientation plane of the material forming the trench epitaxy layer 920. The diamond shape provides more surface area to physically contact the trench epitaxy layer 920. In other embodiments, the trench epitaxy layer 920 may have a shape other than the diamond shape depicted in FIG. 9A.

Figures 10A, 10B:
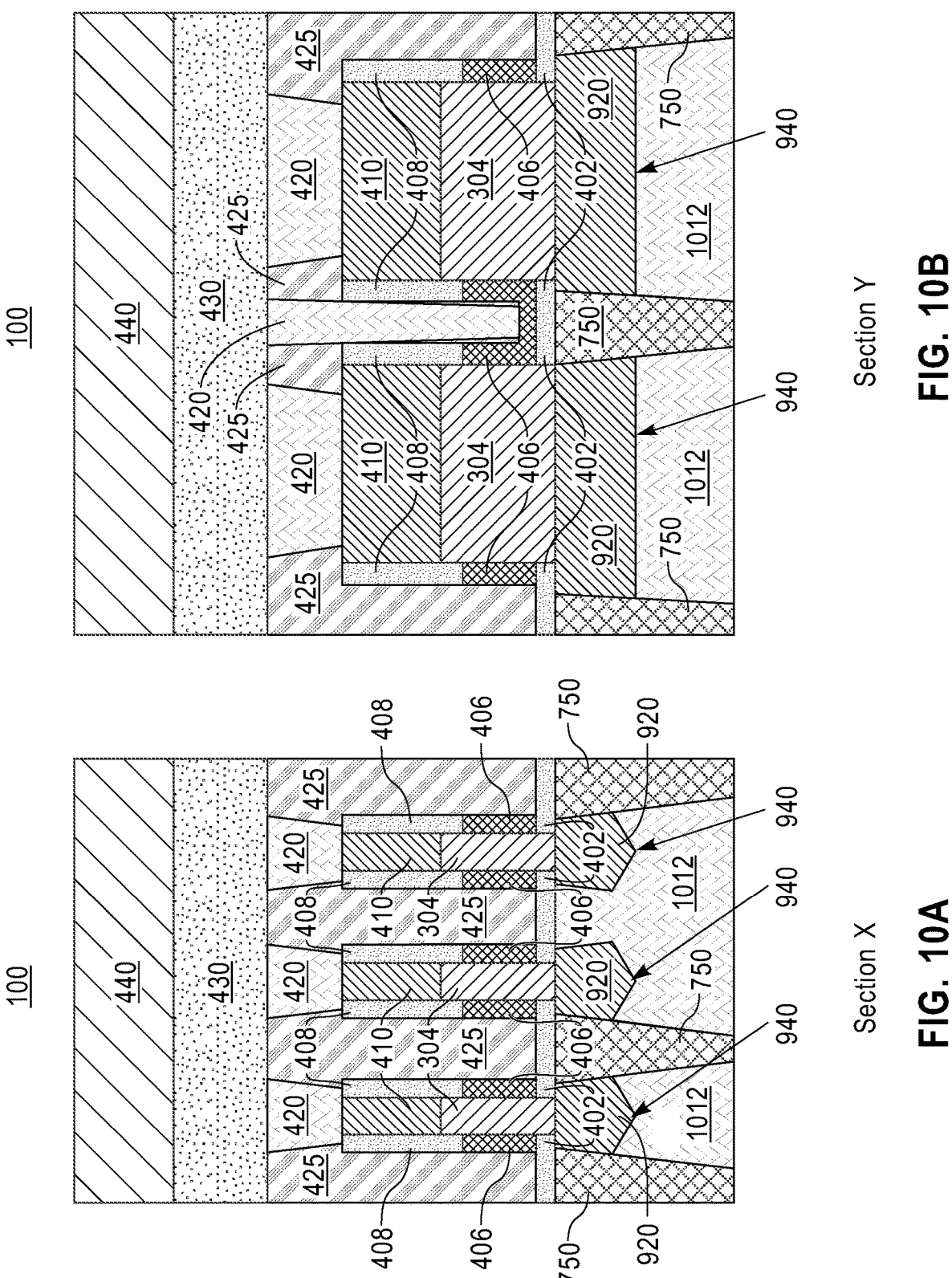
FIG. 10A is a cross-sectional view of the semiconductor structure taken along line X-X, as depicted in FIG. 1, depicting backside contact metallization, according to an embodiment of the present disclosure.
FIG. 10B is a cross-sectional view of the semiconductor structure taken along line Y-Y, as depicted in FIG. 1, according to an embodiment of the present disclosure.

Referring now to FIGS. 10A-10B, cross-sectional views of the semiconductor structure 100 are shown after backside contact metallization, according to an embodiment of the present disclosure. In this embodiment, FIG. 10A is a cross-sectional view of the semiconductor structure 100 taken along line X-X, as depicted in FIG. 1; and FIG. 10B is a cross-sectional view of the semiconductor structure 100 taken along line Y-Y, as depicted in FIG. 1.

In this embodiment, backside metal contacts 1012 can be formed in the semiconductor structure 100 by depositing a conductive material that substantially fills the backside contact openings 810 (FIGS. 8A-8B) and space 960 (FIG. 9A) between adjacent channel fins 304. Backside metal contacts 1012 may be formed using similar conductive materials and analogous deposition processes as those used to form the metal contacts 420. In some embodiments, backside metal contacts 1012 may be formed by depositing, for example, a silicide liner such as Ti, Ni, NiPt, an adhesion metal liner such as TiN, and a layer of low resistance metal, such as Ru, Co, W or Cu.

In one or more embodiments, backside metal contacts 1012 can be formed above, and in direct contact with, neighboring bottom source/drain regions 940 (channel fins 304≥2) located within an N2N space of an NFET region 12 (depicted in FIG. 1) or a P2P space of a PFET region 16 (also depicted in FIG. 1) of the semiconductor structure 100. In such embodiments, the conductive material forming the backside metal contacts 1012 deposits between adjacent bottom source/drain regions 940 substantially filling the space 960 (shown in FIG. 9A) between the adjacent channel fins 304. By filling the space 960 (FIG. 9A) between adjacent channel fins 304, the backside metal contacts 1012 may partially wrap around a portion of the trench epitaxy layer 920 (i.e., bottom source/drain regions 940) for increased contact area. Thus, the backside metal contact 1012, at least in part, surrounds the adjacent bottom source/drain regions 940.

Figures 11A, 11B:
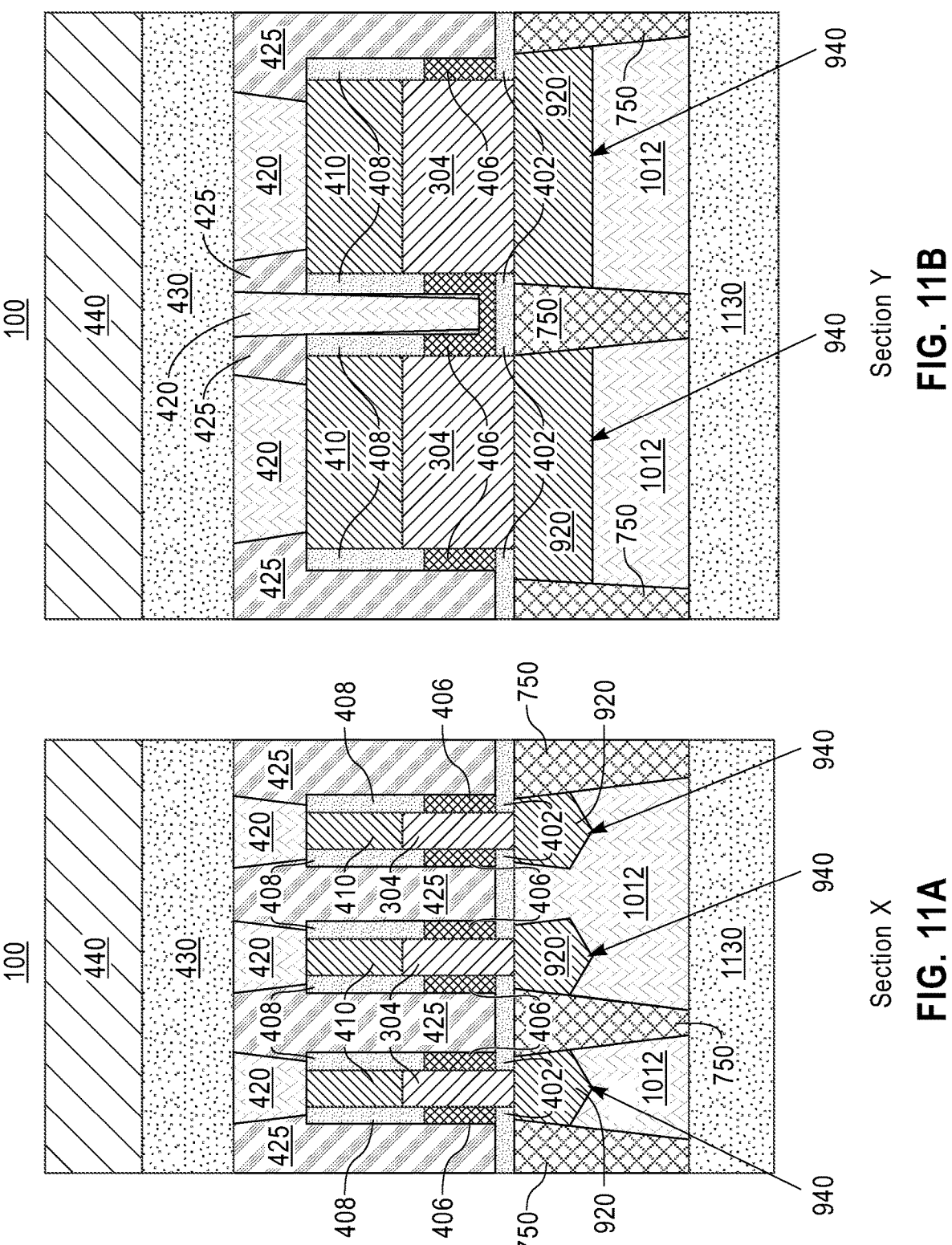
FIG. 11A is a cross-sectional view of the semiconductor structure taken along line X-X, as depicted in FIG. 1, depicting forming a backside interconnect structure, according to an embodiment of the present disclosure.
FIG. 11B is a cross-sectional view of the semiconductor structure taken along line Y-Y, as depicted in FIG. 1, according to an embodiment of the present disclosure.

Referring now to FIGS. 11A-11B, cross-sectional views of the semiconductor structure 100 are shown after forming a backside interconnect structure 1130, according to an embodiment of the present disclosure. In this embodiment, FIG. 11A is a cross-sectional view of the semiconductor structure 100 taken along line X-X, as depicted in FIG. 1; and FIG. 11B is a cross-sectional view of the semiconductor structure 100 taken along line Y-Y, as depicted in FIG. 1.

The simplistically depicted backside interconnect structure 1130 may include, for example, Cu-based metal lines and vias made according to known techniques. According to an embodiment, backside metal contacts 1012 can be electrically connected to backside interconnect structure 1130. Specifically, the backside metal contacts 1012 are in contact with a bottom surface of the backside interconnect structure 1130.

The resulting semiconductor structure 100 includes a VFET device with a self-aligned backside trench epitaxy that provides a bottom source/drain region for the semiconductor structure 100. Embodiments of the present disclosure provide additional options for forming the bottom source/drain region of VFET devices using backside interconnect processes. In the proposed embodiments, backside interconnect processes may not be limited to power supply, they may also be used for signal routing.

The previously described embodiments, provide a semiconductor structure, and a method of making the same, including a channel fin extending vertically from a bottom source/drain region of a field effect transistor, the bottom source/drain region including a trench epitaxy later located underneath a bottommost surface of the channel fin, a high-k metal gate stack disposed along sidewalls of the channel fin, the high-k metal gate being separated from the bottom source/drain region by a bottom spacer, and a top source/drain region located above a topmost surface of the channel fin, the top source/drain region being separated from the high-k metal gate by a top spacer.

In one or more embodiments, a first side of the trench epitaxy layer is in direct contact with the channel fin, and a second side of the trench epitaxy layer, opposing the first side of the trench epitaxy layer, is in direct contact with the backside metal contact. In one or more embodiments, the trench epitaxy layer is epitaxially grown using a low-temperature epitaxial process, and the trench epitaxy layer includes similar materials and a same dopant concentration as the top source/drain region.

Embodiments of the present disclosure further include a front-end-of-line level including the field effect transistor, the front-end-of-line level being electrically connected to a back-end-of-line interconnect level located on a first side of the front-end-of-line level, the field effect transistor including a vertical field effect transistor, and a backside interlayer dielectric surrounding the bottom source/drain region and located on a second side of the front-end-of-line level opposing the first side of the front-end-of-line level.

Embodiments of the present disclosure further include a metal contact within an interlevel dielectric, the metal contact being in electric contact with an uppermost surface of the top source/drain region, and a backside metal contact within the backside interlayer dielectric, the backside metal contact electrically connected to, and vertically aligned with, the bottom source/drain region. The backside metal contact is composed of a conductive material including at least one of Ru, Cu, Co, W, and Al.

In one or more embodiments, the backside metal contact fills an area located between two adjacent bottom source/drain regions partially surrounding a portion of the two adjacent bottom source/drain regions.

In one or more embodiment, the semiconductor structure further includes a backside interconnect structure electrically connected to the backside metal contact, and a carrier wafer in contact with a surface of the back-end-of-line interconnect level opposing the top source/drain region and the metal contact.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a field effect transistor including
    a channel fin extending vertically from a bottom source/drain region, the bottom source/drain region including a trench epitaxy layer located vertically underneath and in direct contact with a bottommost surface of the channel fin,
    a high-k metal gate stack disposed along sidewalls of the channel fin, the high-k metal gate being separated from the bottom source/drain region by a bottom spacer, and
    a top source/drain region located above a topmost surface of the channel fin, the top source/drain region being separated from the high-k metal gate by a top spacer;
a front-end-of-line level, the front-end-of-line level being electrically connected to a back-end-of-line interconnect level located on a first side of the front-end-of-line level, wherein the field effect transistor is a vertical field effect transistor;
a backside interlayer dielectric surrounding the bottom source/drain region and located on a second side of the front-end-of-line level opposing the first side of the front-end-of-line level; and
a backside metal contact within the backside interlayer dielectric, the backside metal contact electrically connected to, and vertically aligned with, the bottom source/drain region, partially surrounding the bottom source/drain region, and partially wrapped around a portion of the trench epitaxy layer.

2. The semiconductor structure of claim 1, further comprising:
a metal contact within an interlevel dielectric, the metal contact being in electric contact with an uppermost surface of the top source/drain region.

3. The semiconductor structure of claim 1, wherein the backside metal contact fills an area located between two adjacent bottom source/drain regions partially surrounding a portion of the two adjacent bottom source/drain regions.

4. The semiconductor structure of claim 1, further comprising:
a backside interconnect structure electrically connected to the backside metal contact.

5. The semiconductor structure of claim 2, further comprising:
a carrier wafer in contact with a surface of the back-end-of-line interconnect level opposing the top source/drain region and the metal contact.

6. The semiconductor structure of claim 1, wherein the backside metal contact is composed of a conductive material selected from the group consisting of Ru, Cu, Co, W, and Al.

7. The semiconductor structure of claim 1, wherein a first side of the trench epitaxy layer is in direct contact with the channel fin, and a second side of the trench epitaxy layer, opposing the first side of the trench epitaxy layer, is in direct contact with the backside metal contact.

8. The semiconductor structure of claim 1, wherein the trench epitaxy layer includes similar materials and a same dopant concentration as the top source/drain region.

9. A method of forming a semiconductor structure, comprising:
forming a channel fin extending vertically from a bottom source/drain region of a field effect transistor, the bottom source/drain region including a trench epitaxy layer located vertically underneath and in direct contact with a bottommost surface of the channel fin;
forming a high-k metal gate stack disposed along sidewalls of the channel fin, the high-k metal gate being separated from the bottom source/drain region by a bottom spacer;
forming a top source/drain region located above a topmost surface of the channel fin, the top source/drain region being separated from the high-k metal gate by a top spacer;
forming a front-end-of-line level including the field effect transistor, the front-end-of-line level being electrically connected to a back-end-of-line interconnect level located on a first side of the front-end-of-line level, wherein the field effect transistor is a vertical field effect transistor;
forming a backside interlayer dielectric surrounding the bottom source/drain region and located on a second side of the front-end-of-line level opposing the first side of the front-end-of-line level; and
forming a backside metal contact within the backside interlayer dielectric, the backside metal contact electrically connected to, and vertically aligned with, the bottom source/drain region, partially surrounding the bottom source/drain region, and partially wrapped around a portion of the trench epitaxy layer.

10. The method of claim 9, further comprising:
forming a metal contact within an interlevel dielectric, the metal contact being in electric contact with an uppermost surface of the top source/drain region.

11. The method of claim 9, wherein the backside metal contact fills an area located between two adjacent bottom source/drain regions partially surrounding a portion of the two adjacent bottom source/drain regions.

12. The method of claim 9, further comprising:
forming a backside interconnect structure electrically connected to the backside metal contact.

13. The method of claim 10, further comprising:
forming a carrier wafer in contact with a surface of the back-end-of-line interconnect level opposing the top source/drain region and the metal contact.

14. The method of claim 9, wherein the backside metal contact is composed of a conductive material selected from the group consisting of Ru, Cu, Co, W, and Al.

15. The method of claim 9, wherein a first side of the trench epitaxy layer is in direct contact with the channel fin and a second side of the trench epitaxy layer, opposing the first side of the trench epitaxy layer, is in direct contact with the backside metal contact.

16. The method of claim 9, wherein the trench epitaxy layer is epitaxially grown using a low-temperature epitaxial process, and wherein the trench epitaxy layer includes similar materials and a same dopant concentration as the top source/drain region.

* * * * *